United States Patent [19]

Futakuchi et al.

[11] Patent Number: 5,278,259
[45] Date of Patent: Jan. 11, 1994

[54] EPOXY RESIN COMPOSITION, EPOXY RESIN CURED MATERIAL, AND LAMINATED SHEET LINED WITH COPPER

[75] Inventors: Michio Futakuchi, Sagamihara; Hiroyuki Nakajima; Takashi Takahama, both of Amagasaki, all of Japan

[73] Assignee: Mitsubishi Denki Kabushiki Kaisha, Tokyo, Japan

[21] Appl. No.: 684,373

[22] Filed: Apr. 12, 1991

[30] Foreign Application Priority Data

Jul. 9, 1990 [JP] Japan .................. 2-180955

[51] Int. Cl.$^5$ .................................. C08F 283/00
[52] U.S. Cl. ................... 525/482; 525/486; 525/524; 525/525; 525/930; 528/96; 528/103; 528/104
[58] Field of Search ............. 525/482, 486, 930, 524, 525/525; 528/96, 103, 104

[56] References Cited

U.S. PATENT DOCUMENTS

| | | | |
|---|---|---|---|
| 3,888,942 | 6/1975 | Tsen .................... | 525/930 |
| 4,212,960 | 7/1980 | Hayashi et al. ......... | 525/930 |
| 4,309,473 | 1/1982 | Minamisawa et al. ..... | 525/930 |
| 4,550,128 | 10/1985 | Chellis ................ | 525/482 |
| 4,769,399 | 9/1988 | Schenz ................. | 525/930 |
| 4,839,444 | 6/1989 | Lavallee ............... | 525/930 |
| 4,853,423 | 8/1989 | Walles et al. .......... | |
| 4,895,755 | 1/1990 | Berman et al. .......... | 525/482 |
| 4,959,425 | 9/1990 | Walker et al. .......... | 525/482 |
| 5,028,668 | 7/1991 | Wang et al. ............ | 525/482 |

FOREIGN PATENT DOCUMENTS

0394965A3 10/1990 European Pat. Off. .
0421337A1 4/1991 European Pat. Off. .

OTHER PUBLICATIONS

Handbook of Epoxy Resins, Lee & Neville Chapter 11 p. 13–14.
Abstract of JP 61-246228 (A), Nov. 1, 1986.

Primary Examiner—Melvyn I. Marquis
Assistant Examiner—Randy Gulakowski
Attorney, Agent, or Firm—Oblon, Spivak, McClelland, Maier & Neustadt

[57] ABSTRACT

An epoxy resin composition comprising:
(A) as a resin chief material a bisphenol A type epoxy resin having the following formula (1),

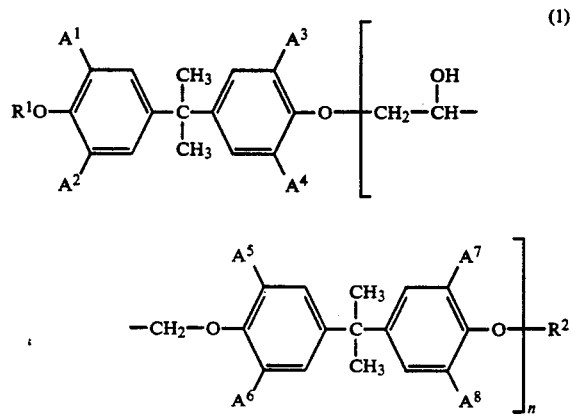

wherein n is 0 to 10, $R^1$ and $R^2$ each represents a glycidyl group, and $A^1$ to $A^8$ each represents a hydrogen atom or a bromine atom;
(B) as an epoxy resin curing agent,
  (b1) a bisphenol A or a brominated product thereof having formula (1) (wherein n is 0, $R^1$ and $R^2$ each represents a hydrogen atom, and $A^1$ to $A^4$ each represents a hydrogen atom or a bromine atom), or
  (b2) a novolac resin of a bisphenol A or a brominated product thereof that is obtained by linking two or more molecules of a bisphenol A or a brominated product thereof having formula (1) (wherein n is 0, $R^1$ and $R^2$ each represents a hydrogen atom, and $A^1$ to $A^4$ each represents a hydrogen atom or a bromine atom), through a methylene group(s) at any of $A^1$ to $A^4$; and
(C) as an additive, a polymeric polyhydroxypolyether represented formula (1) (wherein n is 10 to 1,000, $R^1$ and $R^2$ each represents an alkyl group or hydroxylated alkyl group, and $A^1$ to $A^8$ each represents a hydrogen atom or a bromine atom).

10 Claims, No Drawings

EPOXY RESIN COMPOSITION, EPOXY RESIN CURED MATERIAL, AND LAMINATED SHEET LINED WITH COPPER

The present invention relates to an epoxy resin composition containing a resin chief material with a bisphenol A type skeleton, an epoxy resin curing agent with a bisphenol A type skeleton, and an additive with a bisphenol A type skeleton, particularly an epoxy resin composition further improved in properties inherent in epoxy resins such as good adhesion and heat resistance as well as excellent in toughness, flexibility, and bending strength, a cured material of said composition, and a laminated sheet lined with copper obtained by using said composition.

Conventionally, epoxy resins are used in various industrial fields because of their good adhesion and heat resistance. In particular, glass/epoxy laminated sheets lined with copper used for printed circuit boards are not only used in industrial fields but also are being used in consumer fields where hitherto paper/phenol laminated sheets lined with copper are mainly used.

However, as printed circuit boards are highly densified and are highly multilayered, the present situation has become such that printed circuit boards made up of conventional epoxy resins are not suitably satisfactory.

For example, although conventional epoxy resins are suitably satisfactory in the adhesion strength to copper foil at normal temperature, when a temperature reaches 100° C. or over, the strength drops sharply, and it is a problem when they are used for highly densified printed circuit boards having remarkably fine patterns in view of the reliability. That is, in the flow and reflow step where parts are mounted on the substrate, the temperature of the substrate is locally increased, for example, by the use of infrared radiation or the number of reflow steps is inclined to increase, and therefore in the case of conventional epoxy resin laminated sheets lined with copper, a problem arises, i.e., such a trouble occurs that the copper foil of the patterns comes off. Some parts are mounted with the temperature of the substrate elevated locally to 100° C. or over and then the substrate is attended with the above problem.

Further, as IC cards become popular and appliances become lightweight, the thickness of a substrate is remarkably reduced, and therefore a substrate high in strength in particular bending strength and high in toughness is demanded, but when, for example, repeated bending load is applied to conventional epoxy resin laminated sheets, the strength of the substrate is attended with a problem that it is broken.

Thus, since the interval between parts of patterns is reduced due to the high density, it is required to improve the adhesion between the copper foil and the substrate as well as the heat resistance in view of the reliability. Further, since appliances are made lightweight, thinner, and compact and therefore the substrate is made thinner, it is demanded to improve the bending strength and flexibility. Therefore, epoxy resins and laminated sheets lined with copper that can adequately meet these demands are desired.

In order to meet the above demands, an object of the present invention is to provide a tough epoxy resin composition excellent in heat resistance and adhesion, therefore high in adhesion strength between copper foil and the resin at high temperatures, as well as excellent in flexibility, and high in bending strength.

Another object of the present invention is to provide a tough epoxy resin cured material excellent in heat resistance, adhesion and flexibility and high in bending strength.

A still another object of the present invention is to provide a tough laminated sheet lined with copper high in adhesion strength between the copper foil and the composite material at high temperatures as well as high in bending strength.

The present invention provides the following epoxy resin composition, epoxy resin cured material, and laminated sheet lined with copper.

(1) An epoxy resin composition comprising:

(A) as a resin chief material, a bisphenol A type epoxy resin having the following formula (1),

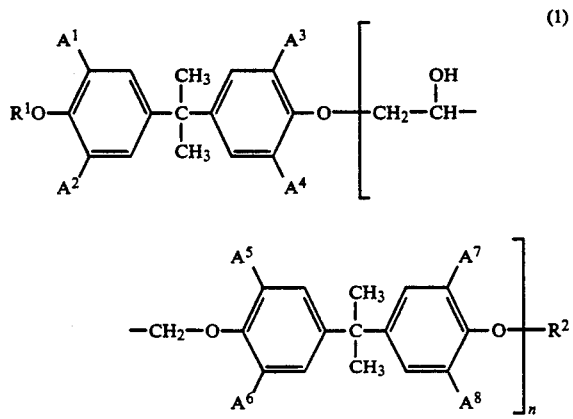

(wherein n is 0 to 10, $R^1$ and $R^2$ each represents a glycidyl group, and $A^1$ to $A^8$ each represents a hydrogen atom or a bromine atom), (B) as an epoxy resin curing agent (b1) a bisphenol A or a brominated product thereof having the formula (1) (wherein n is 0, $R^1$ and $R^2$ each represents a hydrogen atom, and $A^1$ to $A^4$ each represents a hydrogen atom or a bromine atom), or (b2) a novolac resin of a bisphenol A or a brominated product thereof that is obtained by linking two or more molecules of a bisphenol A or a brominated product thereof having the formula (1) (wherein n is 0, $R^1$ and $R^2$ each represents a hydrogen atom, and $A^1$ to $A^4$ each represents a hydrogen atom or a bromine atom) through a methylene group(s) at any of $A^1$ to $A^4$, and (C) as an additive, a polymeric polyhydroxypolyether represented by the formula (1) (wherein n is 10 to 1,000, $R^1$ and $R^2$ each represents an alkyl group or a hydroxylated alkyl group, and $A^1$ to $A^8$ each represents a hydrogen atom or a bromine atom).

(2) An epoxy resin cured material obtained by curing an epoxy resin composition comprising:

(A) a resin chief material, a bisphenol A type epoxy resin having the following formula (1),

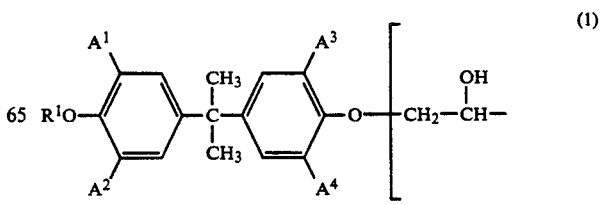

-continued

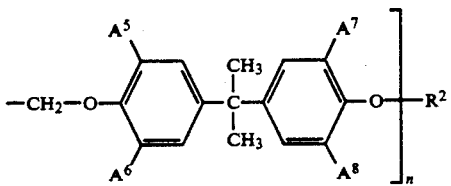

(wherein n is 0 to 10, $R^1$ and $R^2$ each represents a glycidyl group, and $A^1$ to $A^8$ each represents a hydrogen atom or a bromine atom);
(B) as an epoxy resin curing agent,
(b1) a bisphenol A or a brominated product thereof having the formula (1) (wherein n is 0, $R^1$ and $R^2$ each represents a hydrogen atom, and $A^1$ to $A^4$ each represents a hydrogen atom or a bromine atom), or
(b2) a novolac resin of a bisphenol A or a brominated product thereof that is obtained by linking two or more molecules of a bisphenol A or a brominated product thereof having the formula (1) (wherein n is 0, $R^1$ and $R^2$ each represents a hydrogen atom, and $A^1$ to $A^4$ each represents a hydrogen atom or a bromine atom), through a methylene group(s) at any of $A^1$ to $A^4$; and
(C) as an additive, a polymeric polyhydroxypolyether represented by the formula (1) (wherein n is 10 to 1,000, $R^1$ and $R^2$ each represents an alkyl group or a hydroxylated alkyl group, and $A^1$ to $A^8$ each represents a hydrogen atom or a bromine atom).

(3) A laminated sheet lined with copper, which comprises a composite material obtained by impregnating a fiber base material with an epoxy resin composition as stated under (1) above, curing the epoxy resin composition, and laminating one side or both sides of the fiber base material with a copper foil.

The resin chief material (A) used in the present invention is a bisphenol type epoxy resin represented by the formula (1) (wherein n is 0 to 10, $R^1$ and $R^2$ each represents a glycidyl group, and $A^1$ to $A^8$ each represents a hydrogen atom or a bromine atom). This bisphenol type epoxy resin may be bisphenol A type epoxy resin having the formula (1) wherein $A^1$ to $A^8$ each represents a hydrogen atom or a brominated epoxy resin having the formula (1) wherein at least one of $A^1$ to $A^8$ represents a bromine atom and others each represents a hydrogen atom. If fire retardance is needed, a brominated epoxy resin is chosen. Such a bisphenol type epoxy resin is a bisphenol A type epoxy resin which is commonly most widely used.

As a bisphenol A type epoxy resin used in the present invention, diglycidyl ether obtained by the reaction of bisphenol A and/or halogenated bisphenol A and epichlorohydrin can be used. Also, commercially available ones can be used such as Epikote 828 (one having the formula (1) wherein $R^1$ and $R^2$ each represents a glycidyl group, n is about 0.1, and $A^1$ to $A^8$ each represents a hydrogen atom), Epikote 1001 (one having the formula (1) wherein $R^1$ and $R^2$ each represents a glycidyl group, n is about 2.0, and $A^1$ to $A^8$ each represents a hydrogen atom), Epikote 1004 (one having the formula (1) wherein $R^1$ and $R^2$ each represents a glycidyl group, n is about 4.4, and $A^1$ to $A^8$ each represents a hydrogen atom), Epikote 5046 (one having the formula (1) wherein $R^1$ and $R^2$ each represents a glycidyl group, n is about 1.4, and two of $A^1$ to $A^8$ each represents a bromine atom and others each represents a hydrogen atom), and Epikote 5050 (one having the formula (1) wherein $R^1$ and $R^2$ each represents a glycidyl group, n is about 1.3, and $A^1$ to $A^8$ each represents a bromine atom), which are trade names and are manufactured by Yuka Shell Epoxy K.K.). These bisphenol A type epoxy resins may be used alone or in combination.

As the resin chief material (A), the above bisphenol A type epoxy resin may be used with which a non-bisphenol A type epoxy resin is mixed in an amount in the range that does not harm the objects of the present invention.

The epoxy resin curing agent (B) used in the present invention is a bisphenol A or a brominated product thereof (b1) having the formula (1) (wherein n is 0, $R^1$ and $R^2$ each represents a hydrogen atom, and $A^1$ to $A^4$ each represents a hydrogen atom or a bromine atom), or a novolac resin (b2) of a bisphenol A or a brominated product thereof that is obtained by linking two or more molecules of a bisphenol A or a brominated product thereof having the formula (1) (wherein n is 0, $R^1$ and $R^2$ each represents a hydrogen atom, and $A^1$ to $A^4$ each represents a hydrogen atom or a bromine atom) through a methylene group(s) at any of $A^1$ to $A^4$.

The epoxy resin curing agent (B) is characterized by having as its skeleton the skeleton of bisphenol A similarly to the epoxy resin comprising the resin chief material (A) and thereby toughness and heat resistance are provided. If further heat resistance is needed, a novolac resin of bisphenol A or a brominated product thereof is chosen.

As the epoxy resin curing agent (B) used in the present invention, 2,2-bis(4-hydroxyphenyl)propane (one having the formula (1) wherein $R^1$ and $R^2$ each represents a hydrogen atom, n is 0, and $A^1$ to $A^4$ each represents a hydrogen atom), 2,2-bis(3,5-dibromo-4-hydroxyphenyl)propane (one having the formula (1) wherein $R^1$ and $R^2$ each represents a hydrogen atom, n is 0, and $A^1$ to $A^4$ each represents a bromine atom), and a novolac resin comprising these phenol components (one comprising two or more molecules of a compound having the formula (1) that are bonded through a methylene group(s) at any of $A^1$ to $A^4$) can be mentioned.

The additive (C) used in the present invention is a polymeric high molecular polyhydroxypolyether represented by the formula (1) (wherein n is 10 to 1,000, $R^1$ and $R^2$ each represents an alkyl group or a hydroxylated alkyl group, and $A^1$ to $A^8$ each represents a hydrogen atom or a bromine atom).

In the present invention, the additive (C) is also characterized by having as its skeleton the skeleton of bisphenol A similarly to the resin chief material (A) and the epoxy resin curing agent (B). That is, because of the skeleton of bisphenol A of the additive (C), not only toughness and heat resistance are provided as in the cases of the bisphenol A type epoxy resin chief material (A) and the epoxy resin curing agent (B), but also adhesive force and bending strength are considerably improved due to the effect of the polymeric polyhydroxypolyether.

Although the polymeric polyhydroxypolyether used as the additive (C) is a polymeric high molecular linear polymer, since it has basically the same molecular structure as those of the resin chief material (A) and the epoxy resin curing agent (B), these three components can be well mixed without microscopic phase separation.

As the additive (C) used in the present invention, commercially available additives can be used as PHENOTOHTO YP-40 (one having the formula (1) wherein $R^1$ and $R^2$ each represents an alkyl group or a hydroxylated alkyl group, n is about 50, and $A^1$ to $A^8$ each represents a hydrogen atom), PHENOTOHTO YP-50 (one having the formula (1) wherein $R^1$ and $R^2$ each represents an alkyl group or a hydroxylated alkyl group, n is about 50, and $A^1$ to $A^8$ each represents a hydrogen atom), PHENOTOHTO YP-60 (one having the formula (1) wherein RI and $R^2$ each represents an alkyl group or a hydroxylated alkyl group, n is about 50, and $A^1$ to $A^8$ each represents a hydrogen atom), and PHENOTOHTO YPB-40 (one having the formula (1) wherein $R^1$ and $R^2$ each represents an alkyl group or a hydroxylated alkyl group, n is about 50, and $A^1$ to $A^8$ each represents a hydrogen atom or a bromine atom), which are trade names and are manufactured by Totokasei K.K.

The most prominent feature of the present epoxy resin composition resides in that the resin chief material (A), the epoxy resin curing agent (B), and the additive (C) have all the same bisphenol A type skeleton. That is, since the basic molecular structures of the three components, i.e., the epoxy resin chief material (A), the epoxy resin curing agent (B), and the additive (C), are identical, they are mixed on the molecular level and do not suffer phase separation, and as a result a tough epoxy resin composition high in heat resistance and adhesion strength as well as bending strength can be obtained.

In the case of an epoxy resin composition comprising components whose basic molecular structures are not identical, it becomes very difficult to uniformly mix the components, and even if a uniformly dissolved resin composition is attained by sufficient mechanical stirring, microscopic phase separation occurs when left to stand for a long period of time or when made into a prepreg, so that the heat resistance lowers or the adhesion force is not improved enough.

For the present epoxy resin composition, as in the case of usual epoxy resins, a catalyst can be used. Catalysts that can be suitably used include imidazole compounds such as 2-methylimidazole, 2-ethyl-4-methylimidazole, 1-benzyl-2-methylimidazole, 2-phenylimidazole, 2-undecylimidazole, and 2-heptadecylimidazole; tertiary amine compounds such as tetraethylamine, benzyldimethylamine, and 2,4,6-tris(-dimethylaminomethyl)phenol; dicyandiamide and its derivatives, and $BF_3$-monoethylamine.

For the present epoxy resin composition, solvents that are used for usual epoxy resins can be used. As a solvent, for example, an alcohol such as ethyl alcohol, propyl alcohol, and butyl alcohol; an aromatic hydrocarbon such as benzene, toluene and xylene; a ketone such as acetone, methyl ethyl ketone, methyl isobutyl ketone, and cyclohexanone; an ether or an acetic acid ester of ethylene glycol or diethylene glycol such as ethylene glycol monomethyl ether, ethylene glycol monoethyl ether, diethylene glycol monomethyl ether, and ethylene glycol monoethyl ether acetate are suitably used, and also a polar solvent such as dimethylsulfoxide, N-methylpyrolidone and an amide such as N,N-dimethylformamide and N,N-dimethylacetamide can be used. These solvents may be used alone or as a mixture of two or more of them.

In the epoxy resin composition of the present invention, other additives that are generally used in epoxy resins such as fillers, dyes, and pigments can be used.

Although there is no particular restriction on the proportion of the resin chief material (A), the epoxy resin curing agent (B), and the additive (C) in the present epoxy resin composition, it is suitable to use (B) in an amount of 0.7 to 1.2 phenol equivalents to the epoxy equivalent of (A) in view of the properties of the cured material. It is suitable to use (C) in an amount ranging from 0.1 to 20 wt % to (A)+(B). That is, if heat resistance is important, the amount of (C) is decreased, while if adhesion and toughness are important, the amount of (C) is increased.

The present epoxy resin composition is produced by mixing the components (A), (B), and (C), and, if desired, other additives.

Although the present epoxy resin composition thus prepared can be used in the same way as that for conventional epoxy resins, the present epoxy resin composition itself may be used as an additive to other epoxy resin to improve the properties of the latter epoxy resin. However, in this case, the present epoxy resin composition as an additive is required to be used in an amount of at least 10% by weight to the other epoxy resin and curing agent components to which the present epoxy resin composition will be added. If the amount is less than 10% by weight, an intended remarkable effect for improving the adhesion strength and toughness cannot be observed.

Although the present epoxy resin composition can be used in the same field as those where conventional epoxy resins are used, since the heat resistance, adhesion, flexibility, bending strength, etc. are excellent, the present epoxy resin composition is suitably used in the field where these properties are required.

The present epoxy resin cured material can be obtained by curing the above epoxy resin composition.

The present laminated sheet lined with copper comprises a composite material obtained by impregnating a fiber base material such as glass cloth, glass mat, and aramid cloth with the above epoxy resin composition, curing the epoxy resin composition, and laminating one side or both sides of the fiber base material with a copper foil.

Such a laminated sheet lined with copper can be produced in a similar manner to the production of usual epoxy resin laminated sheets lined with copper. That is, a fiber base material such as glass cloth, glass mat, or aramid cloth is impregnated directly with the present resin composition or with a varnish containing the present resin composition dissolved in a solvent which is removed later, thereby forming a prepreg, one side or both sides of the prepreg are laminated with copper foil, and the composition is cured, for example, under heating and pressure to form a laminated sheet lined with copper.

The thus obtained laminated sheet lined with copper is high in the adhesion strength between the copper foil and the composite material at a high temperature as well as high in bending strength and is tough.

Such a laminated sheet lined with copper can be used as a substrate of a printed circuit board and the like.

Now, the present invention will be described in detail with reference to Examples.

EXAMPLE 1

As the resin chief resin (A), Epikote 828 (which is a trade name, is manufactured by Yuka Shell Epoxy K.K. and has an epoxy equivalent of 180 to 190), and as the epoxy resin curing agent (B), a novolac (having a phenol equivalent of 150) of 2,2-bis(4-hydroxyphenyl)propane were mixed with the phenol equivalent/epoxy equivalent ratio (hereinafter referred to as PE/EE ratio) being 0.85, then as the additive (C) PHENOTOHTO YP-50 (which is a trade name and is manufactured by Totokasei K.K.) was added thereto in an amount of 10 parts by weight to the total amount of the resin chief material (A) and the epoxy resin curing agent (B), further 2-ethyl-4-methylimidazole is added thereto in an amount of 0.1 part by weight to the total amount of the above components, and the mixture was dissolved in methyl ethyl ketone so that the solid content might be 50% to obtain an epoxy varnish.

Glass fabric having a thickness of 0.18 mm was impregnated with the epoxy varnish and the epoxy varnish was dried to obtain a prepreg having a resin content of 50 wt %. Four such prepregs were put together and copper foils having a thickness of 35 μm were applied to both sides of the prepreg laminate and the resultant laminate was press-molded to obtain a laminated sheet lined with copper. The molding conditions were such that the press temperature was 180° C., the press pressure was 40 kg/cm², and the press time was 90 min. The results of the assessment of the properties of the laminated sheet lined with copper are shown in Table 1.

EXAMPLE 2

Example 1 was repeated, except that as the resin chief material (A), Epikote 5046 (which is a trade name, is manufactured by Yuka Shell Epoxy K.K., and has an epoxy equivalent of 480) was used, and as a catalyst, benzyldimethylamine was used, thereby preparing a laminated sheet lined with copper. The results of the assessment of the properties of the laminated sheet lined with copper are shown in Table 1.

EXAMPLE 3

Example 1 was repeated, except that as the resin chief material (A), Epikote 1001 (which is a trade name, is manufactured by Yuka Shell Epoxy K.K., and has an epoxy equivalent of 450 to 500) with the PE/EE ratio being 0.95, and as the additive (C), PHENOTOHTO YPB-40 (which is a trade name and is manufactured by Totokasei K.K.) was used in an amount of 5wt %, thereby preparing a laminated sheet lined with copper. The results of the assessment of the properties of the laminated sheet lined with copper are shown in Table 1.

EXAMPLE 4

As an epoxy resin component of the resin chief material (A), a mixture of a non-bisphenol A type polyfunctional epoxy resin TACTIX-742 (which is a trade name, is manufactured by Dow Chemical Co., and has an epoxy equivalent of 162) and a bisphenol A type epoxy resin Epikote 5046 (which is a trade name, is manufactured by Yuka Shell Epoxy K.K., and has an epoxy equivalent of 460 to 490) mixed in a weight ratio of 1:1, and as the epoxy resin curing agent (B), a novolac (having a phenol equivalent of 180) of 2,2-bis(4-hydroxyphenyl)propane were mixed with the PE/EE ratio being 0.90, then as the additive (C), PHENOTOHTO YP-40 (which is a trade name and is manufactured by Totokasei K.K.) was added thereto in an amount of 10 wt % to the total amount of the resin chief material (A) and the epoxy resin curing agent (B), further as a catalyst, 2-phenylimidazole was added in an amount of 0.15 wt % to the resin components, and the resultant mixture was dissolved in acetone so that the solid content might be 55% thereby obtaining an epoxy resin vanish.

Glass fabric having a thickness of 0.18 mm was impregnated with the epoxy varnish and the epoxy vanish was dried to obtain a prepreg having a resin content of 48 wt %. Four such prepregs were put together and a copper foil was applied to each of the opposite surfaces of the prepreg laminate and the resultant laminate was press-molded to obtain a laminated sheet lined with copper. The molding conditions were such that the press temperature was 180° C., the press pressure was 40 kg/cm², and the press time was 100 min. The results of the assessment of the properties of the laminated sheet lined with copper are shown in Table 1.

EXAMPLE 5

Example 4 was repeated, except that as the epoxy resin curing agent (B), 2,2-bis(4-hydroxyphenyl)propane was used with the PE/EE ratio being 0.80 and as a catalyst, dicyandiamide was used in an amount of 1.0 wt %, thereby preparing a laminated sheet lined with copper. The results of the assessment of the properties of the laminated sheet lined with copper are shown in Table 1.

EXAMPLE 6

Example 4 was repeated, except that as an epoxy resin component of the resin chief material (A), a mixture of a non-bisphenol A type polyfunctional epoxy resin EPPN-502 (which is a trade name, is manufactured by Nippon Kayaku Co., Ltd., and has an epoxy equivalent of 160 to 180) and a bisphenol A type epoxy resin Epikote 5050 (which is a trade name, is manufactured by Yuka Shell Epoxy K.K., and has an epoxy equivalent of 380 to 410) mixed in a weight ratio of 1 : 1, and as the epoxy resin curing agent (B), a novolac (having a phenol equivalent of 180) of 2,2-bis(4-hydroxyphenyl)propane, were mixed with the PE/EE ratio being 0.90, then as the additive (C), PHENOTOHTO YP-60 (which is a trade name and is manufactured by Totokasei K.K.) was added thereto in an amount of 10 wt % to the total amount of the resin chief material (A) and the epoxy resin curing agent (B), further as a catalyst, 2-ethyl-4-methylimidazole was used, thereby preparing a laminated sheet lined with copper. The results of the assessment of the properties of the laminated sheet lined with copper are shown in Table 1.

COMPARATIVE EXAMPLE 1

Example 6 was repeated, except that, the bisphenol A type epoxy resin, the Epikote 5050 was not used and only the non-bisphenol A type polyfunctional epoxy resin EPPN- 502 was used, thereby preparing a laminated sheet lined copper. In comparison with the laminated sheets lined with copper obtained in Examples 1 to 6, however, this laminated sheet lined with copper had a turbid whitish appearance. This is considered probably due to the phase separation of the additive (C) during the production of the prepreg. The results of the assessment of the properties of the laminated sheet lined with copper are shown in Table 1.

COMPARATIVE EXAMPLE 2

Example 6 was repeated, except that, instead of the novolac of 2,2-bis(4-hydroxyphenyl) propane, diaminodiphenylsulfone was used in an amount of 20 parts by weight to 100 parts by weight of the resin chief material (A), thereby preparing a laminated sheet lined with copper. In comparison with the laminated sheets lined with copper obtained in Examples 1 to 6, however, this laminated sheet lined with copper had a turbid whitish appearance. The results of the assessment of the properties of the laminated sheet lined with copper are shown in Table 1.

COMPARATIVE EXAMPLE 3

Example 6 was repeated, except that the additive (C) was omitted, thereby preparing a laminated sheet lined with copper. The appearance of the obtained laminated sheet lined with copper was good like Examples 1 to 6 but, for example, the adhesion strength of the copper foil and the bending strength were low. The results of the assessment of the laminated sheet lined with copper are shown in Table 1.

We claim:
1. An epoxy resin composition comprising:
   (A) as a resin material, an epoxy resin having the formula (1),

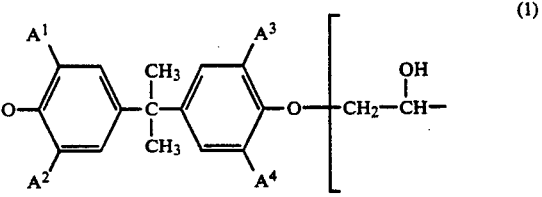

TABLE 1

| Item | Example 1 | Example 2 | Example 3 | Example 4 | Example 5 | Example 6 | Comparative Example 1 | Comparative Example 2 | Comparative Example 3 | Method of measurement |
|---|---|---|---|---|---|---|---|---|---|---|
| Appearance | Good | Good | Good | Good | Good | Good | Turbid and whitish | Turbid and whitish | Good | Judged visually |
| Copper foil adhesion strength (kg/cm, 20° C.) | 2.5 | 2.5 | 2.6 | 2.0 | 2.0 | 2.1 | 1.6 | 1.4 | 1.2 | According to JIS-C 6481 |
| Copper foil adhesion strength (kg/cm, 120° C.) | 1.7 | 1.6 | 1.6 | 1.6 | 1.7 | 1.6 | 1.1 | 1.1 | 1.0 | |
| Insulation resistance ($\Omega$) | $2.0 \times 10^{15}$ | $1.0 \times 10^{15}$ | $1.2 \times 10^{15}$ | $2.0 \times 10^{15}$ | $3.0 \times 10^{15}$ | $1.5 \times 10^{15}$ | $1.5 \times 10^{15}$ | $1.5 \times 10^{15}$ | $2.0 \times 10^{15}$ | $1.5 \times 10^{15}$ |
| Resistance to soldering heat (sec, 260° C.) | >300 | >300 | >300 | >300 | >300 | >300 | >300 | >300 | >300 | |
| Bending strength (kg/mm$^2$) | 65 | 64 | 59 | 64 | 64 | 62 | 47 | 44 | 50 | According to JIS-K 6911 |
| Glass transition temperature (°C.) | 145 | 143 | 138 | 180 | 185 | 185 | 180 | 183 | 185 | According to TMA method |

As shown in the above Examples, since in the epoxy resin composition and the laminated sheet lined with copper obtained therefrom of the present invention, all of the resin chief material (A), the epoxy resin curing agent (B) and the additive (C) that are used therein, have bisphenol A type skeletons, they are mixed on the molecular level, and accordingly satisfactory heat resistance, adhesion, and bending strength are secured.

Thus, according to the present invention, since all of the resin chief material (A), the epoxy resin curing agent (B) and the additive (C) that are used, have bisphenol A type skeletons, a tough epoxy resin composition that is excellent in heat resistance and adhesion, high in the adhesion strength between copper foil and the resin at a high temperature, excellent in flexibility, and high in bending strength can be obtained.

Further, according to the present invention, a tough epoxy resin cured material excellent in heat resistance, adhesion and flexibility, and high in bending strength can be obtained.

Furthermore, according to the present invention, by using the above epoxy resin composition, a tough laminated sheet lined with copper high in adhesion strength between the copper foil and the composite material at a high temperature and high in bending strength can be obtained.

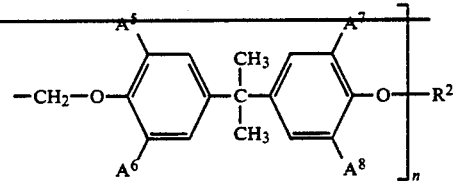

wherein n is 0 to 10, $R^1$ and $R^2$ each represents a glycidyl group, and $A^1$ and $A^8$ each represents a hydrogen atom or a bromine atom;

(B) as an epoxy resin curing agent,
   (b1) a bisphenol A or a brominated product thereof having the above formula (1) wherein n is 0, $R^1$ and $R^2$ each represents a hydrogen atom, $A^1$ to $A^4$ each represents a hydrogen atom or a bromine atom, or
   (b2) a novolac resin of a bisphenol A or a brominated product thereof that is obtained by linking two or more molecules of a bisphenol A or a brominated product thereof having the formula (1) wherein n is 1, $R^1$ and $R^2$ each represents a hydrogen atom, and $A^1$ to $A^4$ each represents a hydrogen atom or a bromine atom, through a methylene group(s) at any of $A^1$ to $A^4$; and (C) as an additive, a polymeric polyhydroxypolyether represented by the formula (1) wherein n is 10 to 1,000, $R^1$ and $R^2$ each represents an alkyl group or a hydroxylated alkyl group, and $A^1$ to $A^8$ each represents a hydrogen atom or a bromine atom.

2. The epoxy resin composition according to claim 1, wherein the epoxy resin curing agent (B) is contained in an amount of from 0.7 to 1.2 phenol equivalents to the epoxy equivalent of the resin material (A), and the additive (C) is contained in an amount of from 0.1 to 20% by weight to the total amount of the resin material (A) and the epoxy resin curing agent (B).

3. The epoxy resin composition according to claim 1, wherein the resin material (A) is an epoxy resin having the formula (1) in which all of $A^1$ and $A^8$ are hydrogen atoms.

4. The epoxy resin composition according to claim 1, wherein the resin material (A) is a brominated epoxy resin having the formula (1) in which at least one of $A^1$ and $A^8$ is a bromine atom and the remaining ones are hydrogen atoms.

5. The epoxy resin composition according to claim 1, wherein the resin material (A) is selected from the group consisting of diglycidyl ethers obtained by reacting epichlorohydrin with 1) bisphenol A, 2) halogenated bisphenol A, or 3) a mixture of 1) and 2).

6. The epoxy resin composition according to claim 1, wherein the resin material (A) is at least one member selected from the group consisting of one having the formula (1) in which $R^1$ and $R^2$ are glycidyl groups, n is 0.1 and $A^1$ to $A^8$ are hydrogen atoms; one having the formula (1) in which $R^1$ and $R^2$ are glycidyl groups, n is 2.0 and $A^1$ to $A^8$ are hydrogen atoms; one having the formula (1) in which $R^1$ and $R^2$ are glycidyl groups, n is 4.4, and $A^1$ to $A^8$ are hydrogen atoms; one having the formula (1) in which $R^1$ and $R^2$ are glycidyl groups, n is 1.4, $A^1$ to $A^4$ are hydrogen atoms, two of $A^5$ to $A^8$ are bromine atoms and the remaining ones are hydrogen atoms; and one having the formula (1) in which $R^1$ and $R^2$ are glycidyl groups, n is 1.3 and $A^1$ to $A^8$ are bromine atoms;

the epoxy resin curing agent (B) is at least one member selected from the group consisting of 2,2-bis(4-hydroxyphenyl)propane; 2,2-bis(3,5-dibromo-4-hydroxyphenyl)propane; and a novolac resin of these phenol components; and the additive (C) is at least one polymeric polyhydroxypolyether selected from the group consisting of one having the formula (1) in which $R^1$ and $R^2$ are an alkyl group or a hydroxylated alkyl group, n is 50 and $A^1$ to $A^8$ are hydrogen atoms; and one having the formula (1) in which $R^1$ and $R^2$ are an alkyl group or a hydroxylated alkyl group, n is 50 and $A^1$ to $A^8$ are hydrogen atoms and bromine atoms.

7. The epoxy resin composition according to claim 1, further comprising a non-bisphenol A epoxy resin which is not described by formula (1).

8. An epoxy resin composition containing the epoxy resin composition of claim 1 in an amount of at least 10% by weight as an additive.

9. An epoxy resin cured material obtained by curing an epoxy resin composition comprising:
(A) as a resin material an epoxy resin having the following formula (1),

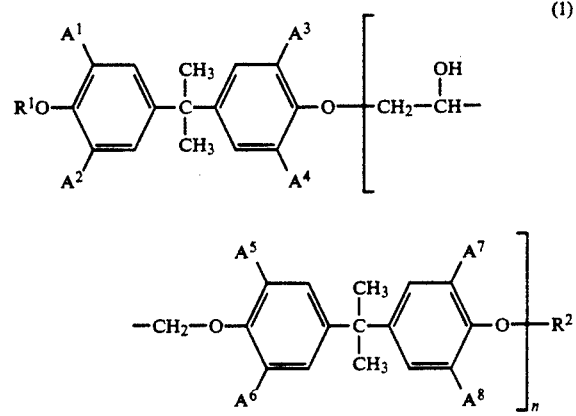

wherein n is 0 to 10, $R^1$ and $R^2$ each represents a glycidyl group, and $A^1$ to $A^8$ each represents a hydrogen atom or a bromine atom;

(B) as an epoxy resin curing agent,
(b1) a bisphenol A or a brominated product thereof having the above formula (1) wherein n is 0, $R^1$ and $R^2$ each represents a hydrogen atom, and $A^1$ to $A^4$ each represents a hydrogen atom or a bromine atom, or
(b2) a novolac resin of a bisphenol A or a brominated product thereof that is obtained by linking two or more molecules of bisphenol A or a brominated product thereof having the above formula (1) wherein n is 0, $R^1$ and $R^2$ each represents a hydrogen atom, and $A^1$ to $A^4$ each represents a hydrogen atom or a bromine atom, through a methylene group(s) at any of $A^1$ to $A^4$; and (C) as an additive, a polymeric polyhydroxypolyether represented by formula (1) wherein n is 10 to 1,000, $R^1$ and $R^2$ each represents a alkyl group or a hydroxylated alkyl group, and $A^1$ to $A^8$ each represents a hydrogen atom or a bromine atom.

10. A laminated sheet lined with copper obtained by impregnating a fiber base material with an epoxy resin composition as claimed in claim 1, curing the epoxy resin composition, and laminating one side or both sides of the fiber base material with a copper foil.

* * * * *